United States Patent
Papakos et al.

(10) Patent No.: US 8,605,459 B2
(45) Date of Patent: Dec. 10, 2013

(54) STACKABLE CABLE TRAY

(75) Inventors: Kimon Papakos, Chicago, IL (US); Scott A. Blakemore, Warrenville, IL (US); Mark E. Boduch, Geneva, IL (US)

(73) Assignee: Tellabs Operations, Inc., Naperville, IL (US)

( * ) Notice: Subject to any disclaimer, the term of this patent is extended or adjusted under 35 U.S.C. 154(b) by 0 days.

(21) Appl. No.: 13/031,016

(22) Filed: Feb. 18, 2011

(65) Prior Publication Data

US 2011/0132855 A1 Jun. 9, 2011

Related U.S. Application Data

(63) Continuation of application No. 12/036,036, filed on Feb. 22, 2008, now Pat. No. 7,916,502.

(60) Provisional application No. 60/902,985, filed on Feb. 22, 2007.

(51) Int. Cl.
*H02B 1/20* (2006.01)

(52) U.S. Cl.
USPC .......................................... 361/826; 361/825

(58) Field of Classification Search
USPC .............................................. 361/826; 211/26
See application file for complete search history.

(56) References Cited

U.S. PATENT DOCUMENTS

| | | |
|---|---|---|
| 2,917,676 A | 12/1959 | Daniels |
| 2,987,364 A | 6/1961 | Fall |
| 3,081,139 A | 3/1963 | Hines et al. |
| 4,553,674 A | 11/1985 | Yoshikawa et al. |
| 4,764,422 A * | 8/1988 | Hill et al. .................. 428/309.9 |
| 5,398,822 A | 3/1995 | McCarthy et al. |
| 5,896,273 A | 4/1999 | Varghese et al. |
| 5,991,163 A | 11/1999 | Marconi et al. |
| 6,011,221 A * | 1/2000 | Lecinski et al. ............ 174/72 A |
| 6,025,989 A | 2/2000 | Ayd et al. |
| 6,181,549 B1 | 1/2001 | Mills et al. |
| 6,195,493 B1 | 2/2001 | Bridges |
| 6,285,565 B1 * | 9/2001 | Åberg et al. .................. 361/826 |
| 6,347,714 B1 * | 2/2002 | Fournier et al. ................. 211/26 |
| 6,388,891 B1 | 5/2002 | Falkenberg et al. |

(Continued)

FOREIGN PATENT DOCUMENTS

JP 2001345578 12/2001

OTHER PUBLICATIONS

Converting Multi-Degree SBOADM Configurations, 76.7144FP41/25, Tellabs 7100 Optical Transport System. Tellabs, Inc., Revision A, Jun. 2007. 220 sheets.

Converting Multi-Degree SBOADM Configurations, 76.7144FP42/25, Tellabs 7100 Optical Transport System. Tellabs, Inc., Revision B, Jan. 2008. 154 sheets.

(Continued)

*Primary Examiner* — Hung S Bui
(74) *Attorney, Agent, or Firm* — Fitzpatrick, Cella, Harper & Scinto

(57) ABSTRACT

A cable tray is provided comprising a housing defining an interior portion, the housing having at least one positioned opening formed therein and also having plural, open ends in communication with the interior portion and the at least one positioned opening for passage of at least one cable therethrough. The housing is adapted to be coupled to at least one external surface, such that at least one of the plural, open ends substantially aligns with at least one open end of a housing of at least one further cable tray.

23 Claims, 10 Drawing Sheets

(56) References Cited

U.S. PATENT DOCUMENTS

| | | | |
|---|---|---|---|
| 6,467,633 B1 | 10/2002 | Mendoza | |
| 6,469,244 B1 * | 10/2002 | Harrison et al. | 174/360 |
| 6,543,626 B1 * | 4/2003 | Mendoza | 211/26 |
| 6,554,142 B2 | 4/2003 | Gray | |
| 6,594,148 B1 | 7/2003 | Nguyen et al. | |
| 6,597,576 B1 | 7/2003 | Smith et al. | |
| 6,796,438 B2 | 9/2004 | Mendoza | |
| 6,823,063 B2 | 11/2004 | Mendoza | |
| 6,824,312 B2 | 11/2004 | McClellan et al. | |
| 6,870,095 B1 * | 3/2005 | Whitted | 174/481 |
| 6,927,983 B1 | 8/2005 | Beseth et al. | |
| 7,087,840 B2 | 8/2006 | Herring et al. | |
| 7,229,050 B2 | 6/2007 | Schloss | |
| 7,362,941 B2 | 4/2008 | Rinderer et al. | |
| 7,391,625 B2 | 6/2008 | Mendoza | |
| 7,715,213 B2 | 5/2010 | Mendoza | |
| 7,995,357 B2 * | 8/2011 | Hruby et al. | 361/826 |
| 2003/0223196 A1 | 12/2003 | Smith et al. | |
| 2004/0145869 A1 | 7/2004 | Tanaka et al. | |
| 2004/0196631 A1 | 10/2004 | Ueda et al. | |
| 2005/0052843 A1 | 3/2005 | Baker et al. | |
| 2005/0068722 A1 | 3/2005 | Wei | |
| 2005/0162831 A1 | 7/2005 | Shum et al. | |
| 2005/0254210 A1 | 11/2005 | Grady et al. | |
| 2006/0126292 A1 | 6/2006 | Pfahnl et al. | |
| 2006/0180556 A1 | 8/2006 | Shih et al. | |
| 2006/0225481 A1 | 10/2006 | Kato et al. | |
| 2006/0274515 A1 | 12/2006 | Arthur et al. | |
| 2008/0217962 A1 | 9/2008 | Boduch et al. | |
| 2008/0233858 A1 | 9/2008 | Womac et al. | |

OTHER PUBLICATIONS

Converting Multi-Degree SBOADM Configurations, 76.7144FP43/25, Tellabs 7100 Optical Transport System. Tellabs, Inc., Revision A, Apr. 2008. 158 sheets.

System Engineering, 76.7144FP43/6, Tellabs 7100 Optical Transport System. Tellabs, Inc., Revision A, Apr. 2008. 332 sheets.

Expansion Procedure, 76.7144FP43/13, Tellabs 7100 Optical Transport System. Tellabs, Inc., Revision A, Apr. 2008. 562 sheets.

Thermal Computations for Electronic Equipment. Gordon N. Ellison. Van Nostrand Reinhold Company Inc. 1984. pp. 141-160.

2000-2001 Oriental Motor General Catalog, Section C, Cooling Fans, http://www.orientalmotor.com/products/pdfs/CoolingFans/SectionCIntro__C2-C27.pdf, Oriental Motor U.S.A. Corp. 2000. pp. C-12, C-13, C-16, and C-22 to C-27.

2005-2006 Oriental Motor General Catalog, Section F, Technical Reference, Motor and Fan Sizing, Fan Sizing Calculations, http://www.orientalmotor.com/products/pdfs/F_TecRef/TecFanSiz.pdf Oriental Motor U.S.A. Corp. 2005. p. F-11.

Office Action dated Jul. 20, 2010 in U.S. Appl. No. 12/036,041, Applicants: Mark Boduch et al.

Office Action dated Dec. 7, 2010 in U.S. Appl. No. 12/036,041, Applicants: Mark Boduch et al.

Office Action dated Jun. 21, 2011 in U.S. Appl. No. 12/036,041, Applicants: Mark Boduch et al.

Office Action dated Oct. 26, 2011 in U.S. Appl. No. 12/036,041, Applicants: Mark Boduch et al.

Office Action dated Feb. 28, 2012 in U.S. Appl. No. 12/036,041, Applicants: Mark Boduch et al.

* cited by examiner

STACKABLE CABLE TRAY

CROSS REFERENCE TO RELATED APPLICATIONS

This application is a continuation of application Ser. No. 12/036,036, filed Feb. 22, 2007, now allowed, which claims the benefit of U.S. Provisional Application No. 60/902,985, filed Feb. 22, 2007, the contents of which are incorporated by reference as if fully set forth herein, including Appendices 1-11.

FIELD

Example embodiments of the present invention relate generally to a cable management apparatus, and more particularly, to a stackable cable tray for rack-mountable electronic equipment that may be attached to a rack-mountable chassis. When a plurality of chassis are stacked the cable trays of those chassis align, forming a continuous cable tray along the stack of chassis.

BACKGROUND

Modular electronic equipment typically is designed to be arranged within standard sized racks, frames, and cabinets. Each rack typically includes first and second vertical supports that are separated by an opening. The opening widths of racks tend to be standard sized, as adopted by industry, manufacturers, and/or governments. In the United States, for example, telecommunication service providers often use racks having opening widths of twenty-three (23) inches, whereas telephone companies in European countries may use racks having opening widths of nineteen (19) inches.

Often, modular electronic equipment is installed in a chassis and the chassis is then mounted within the opening of a rack. In the case of modular communication equipment, a chassis may house optical electronic equipment such as transmitters, receivers, intelligent control interface modules, power supplies, and the like. A chassis may also house cooling fans or other cooling mechanisms to aid in controlling the operating temperature of the equipment modules.

Conventionally, cables are connected directly to the modules in order to couple the modules to other electronic equipment. The other equipment may be located within the same chassis, within another chassis in the same rack, or elsewhere.

Due to the large number of cables that route to the modules of a chassis the area of cable connections becomes cluttered with crisscrossing cables that may make it difficult or impossible to isolate and perform maintenance on one or more modules without disrupting the cabling routing to other modules in the chassis. One typical example of this occurs when several chassis are mounted horizontally in a rack, one over another, forming a vertical stack. In such a configuration cables from upper disposed chassis are routed in front of lower disposed chassis in the stack, preventing access to the chassis and equipment behind the cable.

SUMMARY

In one example embodiment of the invention, a cable tray is provided comprising a housing defining an interior portion, the housing having at least one positioned opening formed therein and also having plural, open ends in communication with the interior portion and the at least one positioned opening for passage of at least one cable therethrough. The housing is adapted to be coupled to at least one external surface, such that at least one of the plural, open ends substantially aligns with at least one open end of a housing of at least one further cable tray.

BRIEF DESCRIPTION OF THE DRAWINGS

Other features of the example embodiments of the invention will be more readily understood from the following detailed description of specific embodiments thereof when read in conjunction with the accompanying drawings, in which.

Identically labeled elements appearing in different ones of the figures represent the same components and may not be described separately in detail in the description of each figure.

DETAILED DESCRIPTION

The terms "vertical" and "vertically," as used herein, mean extending in a plane substantially perpendicular to a reference surface, such as a horizontal surface or other reference surface. The term "horizontal" and "horizontally," as used herein, mean extending in a plane substantially parallel to the reference surface.

Figure 1:
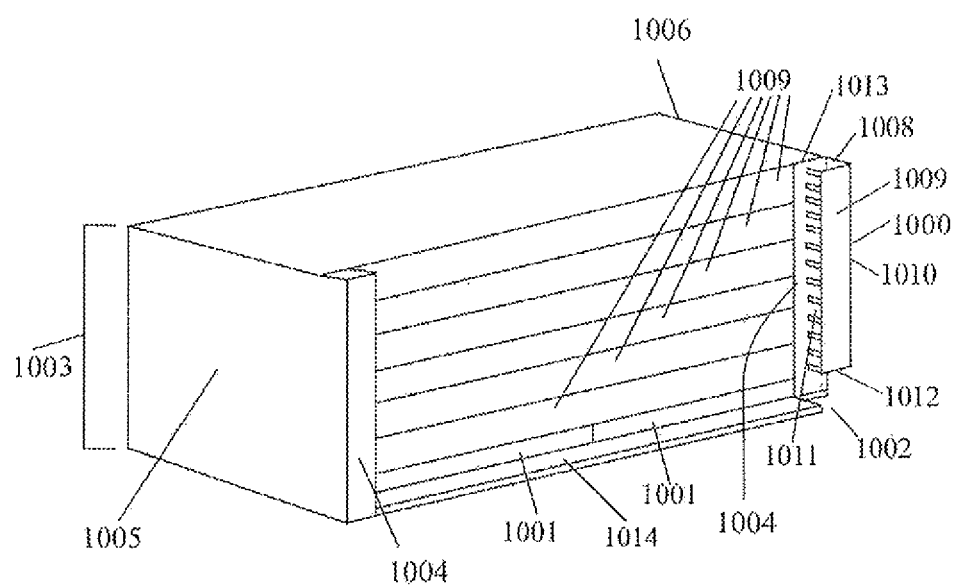
FIG. 1 is a perspective view of a rack mountable chassis that includes a stackable fiber tray in accordance with an example embodiment of the invention.

An example aspect of the invention, relating to a cable tray will now be described, with reference made to FIG. 1. In the example embodiment illustrated in FIG. 1, a cable tray 1000 is shown mounted to at least one front face or side 1004 of a chassis 1003, and extends along at least a portion of that front side adjacent to a lateral side 1006 of the chassis 1003. In the illustrated embodiment of FIG. 1, the cable tray 1000 extends lengthwise perpendicularly to planes in which card module slots 1001 and 1009 extend. Cable tray 1000 can be at least one component that is removably attached to at least one front face or side 1004 of the chassis 1003 using a suitable attaching mechanism; however, in an alternate embodiment of the invention, the cable tray 1000 may be integral or otherwise fixedly attached to the chassis. In other example embodiments the cable tray 1000 can be mounted to other parts of the chassis 1003 besides, or in addition to, at least one side 1004. Also shown in the example embodiment of the cable tray 1000 in FIG. 1 is a cable escape 1002 for routing cables between the card module slots 1001 and the exterior of the cable tray 1000. The cable escape 1002 is formed in the illustrated example as a cutout in a lower surface of chassis 1003 below cable tray 1000.

The cable tray 1000 is comprised of a housing defining an interior portion. The cable tray housing has an interior surface and exterior surface. While the cross-sections of the housing shown in FIG. 1 have rectilinear interior and exterior surfaces, alternatively, those surfaces are not so limited and may also be curvilinear or any other uniform or non-uniform cross-section throughout the length of the cable tray.

The housing includes a first side 1011, a second side 1010 (not shown in FIG. 1), a base 1013, and a front side 1009. The exterior surface of the housing includes at least one positioned opening, such as the openings shown formed in the first surface 1011. These openings are suitably spaced to at least allow a cable or wire to pass therethrough for routing to a location in or outside of the chassis 1003, such as to a connector on a module in the chassis or an external destination. The cable tray 1000 has a first end opening 1008 and a second end opening 1012 for passage of at least one cable therethrough.

A cable tray may also be used in a cable management system that includes a cable ledge 1014 running parallel to the direction of the module slots 1001, 1009 and between the cable escape 1002 and the front side or surface of the chassis below modules 1001. The ledge 1014 may be integral with the chassis 1003 or may be a separate surface fastened to the chassis 1003 by a suitable fastener or fastened to the cable tray 1000. The ledge 1014 can be useful, for example, to provide a strain relief for cables and their terminating connectors (not shown) that may be connected to modules in module slots 1001 and that are routed through the cable escape 1002. In such an example, cables (not shown) connected to modules in module slots 1001 can rest against the top surface of the ledge 1014 and be routed through the cable escape 1002, in a manner similar to the routing of cables 1503 shown in FIG. 6, for example.

Interior surfaces of the first side 1011, second side 1010, base 1013, and the front side 1009 surround a volume or channel in the interior of the tray 1000. This volume or channel is configured to accommodate at: least one cable (not shown) in a path that extends between the first and second end openings 1008, 1012. In another example embodiment, the positioned opening is formed in at least a portion of at least one of the sides 1010, 1011, 1009 to permit passage of the cable between the interior portion of the housing and a location outside the housing.

Cable tray 1000 may be mounted to the front side or face 1004 of the chassis 1003 at the base 1013 using a suitable mounting mechanism, including, but not limited to, a snap fit connection, threaded fasteners, or the like. Alternatively, the cable tray 1000 may be disposed adjacent front side or face 1004 (or elsewhere) of the chassis 1003 by being attached to the side 1006 (or another part) of the chassis 1003, using suitable fasteners.

The stackable cable tray may be formed from any suitable material including plastic, metal, composites, rubber, and suitable combinations of the foregoing.

Figure 2:
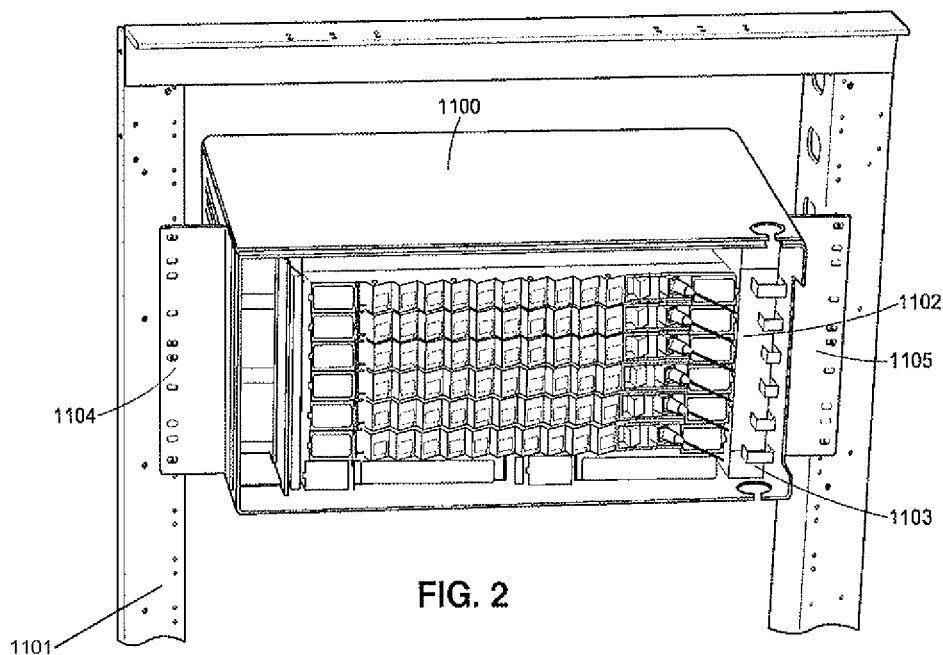
FIG. 2 is a perspective view of a rack mountable chassis that includes a stackable fiber tray according to an example embodiment of the invention.
Figure 3:
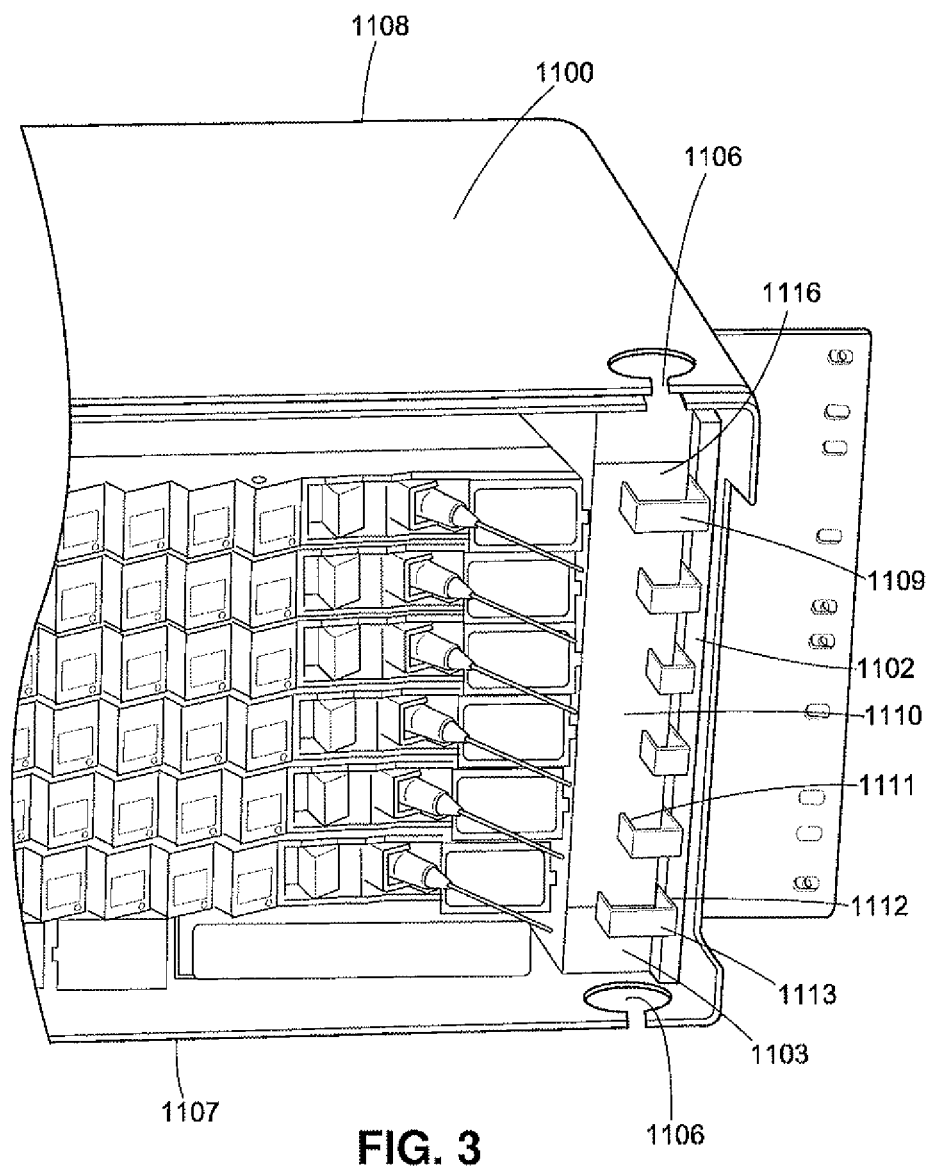
FIG. 3 is an exploded view of part of the chassis of FIG. 2.

FIG. 2 shows an example of a chassis 1100 that can be similar to the chassis of FIG. 1, mounted in a rack 1101 via mounting brackets 1104 and 1105. FIG. 3 shows a larger-scale version of the chassis 1100, including the stackable cable tray 1102 shown in FIG. 2 having a cable escape 1103. In this example embodiment a top side 1108 and bottom side 1107 of the chassis 1100 include substantially circular cutouts 1106 above and below the cable tray 1102. The circular cutouts 1106 facilitate cable routings through the chassis housing and the cable tray 1102 and allow for cables from adjacent chassis (not shown in FIGS. 2 and 3) to pass from one chassis to another, and to and from separate modules within the chassis. While in the illustrated embodiment the cable tray 1102 is shown as being used in conjunction with a chassis 1100 having circular cutouts 1106, the example embodiments of the invention are not limited to being used with a chassis having circular cutouts, and in other example embodiments, a cable tray (such as tray 1102) can be used with chassis having cutouts of other shapes, or having no cutouts at all.

The cable tray 1102 is comprised of a housing that includes a base 1110 connected to at least one cable retaining member 1109 at an attached end 1112 (shown also in FIG. 3A) of the member 1109. The cable tray can be formed as a single piece or alternatively can be formed from more than one separate piece. The cable tray 1100 in FIG. 3 is shown having a plurality of cable retaining members 1109. When a plurality of cable retaining members are included with the cable tray 1102, the cable retaining members may not be of uniform size, as is shown in FIG. 3. Alternatively, in other example embodiments of the cable tray, the cable retaining members can be of uniform size. It can be useful to configure the cable retaining members to be of non-uniform size, as shown in FIG. 3, to further organize cables routed through the cable tray 1102 depending on their intended termination position within the chassis 1100 across from a corresponding position along the length of the cable tray. For example, in a case where most of the cables passing through the cable tray 1102 terminate at modules of the chassis 1100 to which the cable tray 1102 is attached, it can be useful to further separate and route those terminating cables through the upper end opening of the cable tray 1102 for distribution of cables to the modules in the upper half of the chassis 1100 and to route cables through the lower end opening of the cable tray 1102 for distribution of cables to modules installed in the lower half of the chassis 1100. Where fewer cables in a bundle of cables terminate at modules in the chassis 1100 positioned closer to the center of the cable tray 1102, the cable retaining member positioned near the center of the cable tray can be configured to have a smaller opening than another retaining member positioned closer to one of the end openings in order to more securely retain the reduced number of cables passing through the cable retaining member. Also, the cross-sectional shape of the cable retaining members 1109 shown in FIG. 3 is substantially a U-shape. However, alternatively, the cross-sections of the retaining members 1109 are not limited to a U-shape and may also be curvilinear, or any other uniform or non-uniform cross-section throughout the length of the member 1109, which are fully within the scope of the invention.

Figure 3A:
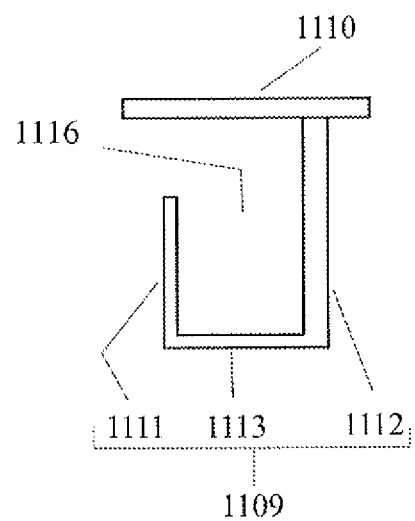
FIG. 3A is a cross-sectional view of a retaining member and base of FIG. 3.

As shown in FIG. 3 and in greater cross-sectional detail in FIG. 3A, the cable retaining member has a free end 1111 opposite to the attached end 1112, the free end 1111 being spaced apart from the attached end 1112 by an extension portion or surface 1113. While the extension surfaces 1113 shown in FIG. 3 have non-uniform lengths, in other embodiments, the length of the extension surfaces 1113 may be uniform. The free end 1111 is also separated from the base 1110 by a predetermined distance forming a gap between the base 1110 and the part of the end 1111 which faces the base 1110. At least one portion of the cable retaining member 1109 may be configured to be flexible so that the gap between the free end 1111 and the base 1110 may be enlarged by displacing the free end 1111 relative to the base 1110 so that at least one cable (not shown) can pass through the opening formed between the free end 1111 and the base 1110. The predetermined distance of the gap is configured to be suitable to prevent a cable to pass through the gap when the free end is not displaced. An interior portion 1116 of the cable tray is surrounded at least in part by a surface of the base 1110 and one or more interior facing surfaces of the cable retaining member 1109.

In FIG. 3 a ledge 1107 of the cable tray extends forward from the chassis 1100 to provide a surface that can be used advantageously as a surface upon which cables (not shown) horizontally routed through the cable escape 1103 can rest, thereby, for example, providing strain relief for such cables connected to locations in the chassis 1100. In FIG. 3 the ledge 1107 is shown as being integrally formed with the chassis 1100. However, in alternative embodiments the ledge can be formed as a single piece used in conjunction with the cable tray 11.02 or can be formed integrally with the cable tray 1102 and positioned at a desired location along the length of the cable tray.

By virtue of the cable tray 1102 shown in FIG. 3, at least one cable (not shown) can be routed through the interior portion 1116 and between the interior portion 1116 and desired locations, such as, for example, a module in the chassis by passing through at least one opening formed between adjacent cable retaining members 1109 or between a cable retaining member 1109, side 1108, and the ledge 1107

Figure 4:
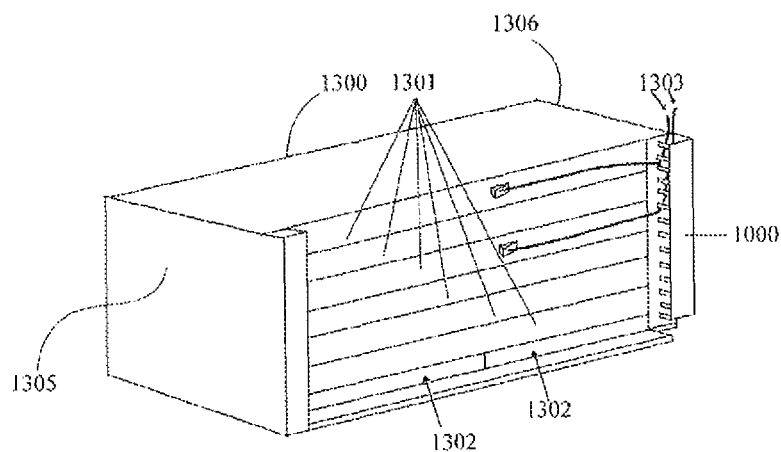
FIG. 4 is a perspective view of an example embodiment of a chassis that includes a stackable cable tray showing cable routed from the stackable cable tray to individual card modules.
Figure 5:
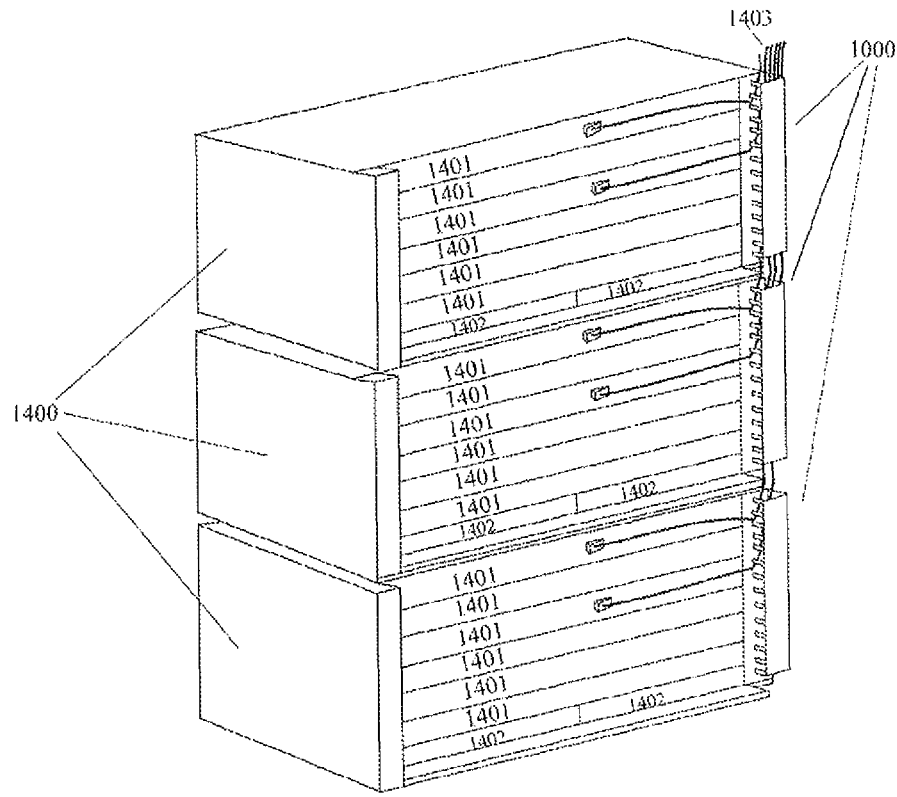
FIG. 5 is a perspective view of plural rack-mountable chassis showing cable routing between chassis through stackable cable trays, according to an example embodiment of the invention.

FIG. 4 shows an example of how cables 1303 are routed to and from a chassis 1300 by way of fiber tray 1000, and to and from individual card modules 1301, 1302. Of course, that example is not limiting to the scope of the present invention, and other routings also can be provided. In FIG. 5 horizontally disposed chassis 1400 are mounted on top of one another, or "stacked", such that cable trays 1000 also are "stacked" substantially vertically aligned with each other. Cables 1403 can be routed from one chassis 1400 to at least one other chassis, and between card modules 1401, 1402 within the same chassis 1400 or different chassis 1400, and between card module slot locations and locations outside the respective chassis.

Figure 6:
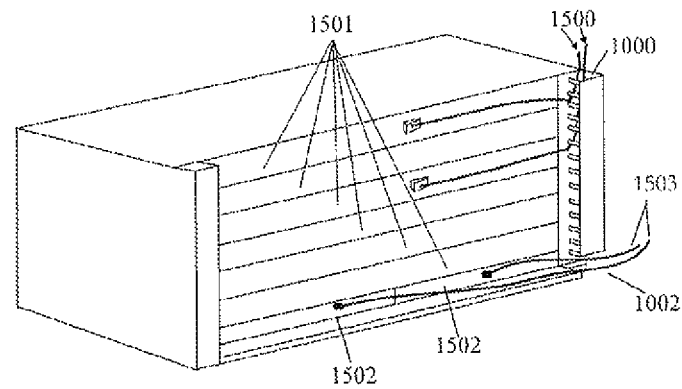
FIG. 6 is a perspective view of a rack-mountable chassis like that of FIG. 1, showing cable routing from the stackable cable tray to modules and cable routed from modules to outside of the cable tray through an escape passage, according to an example embodiment of the invention.

FIG. 6 shows cables 1500, 1503 routing to/from outside of the cable tray 1000 through the cable tray 1000 and escape passage 1002, respectively. Cable routing through the escape passage 1002 can be useful to conserve space within the cable tray 1000 and to reduce electrical signal noise between cables. These reasons are not intended to be limiting to the scope of the invention, and one of ordinary skill in the art will appreciate in view hereof that there may be other uses for routing cables to/from outside the cable tray 1000 in this manner. The location for the cable escape passage 1002 can be anywhere along the length of the cable tray 1000, such as, for example, adjacent one end of the cable tray 1000, as shown in FIG. 6, or elsewhere.

Figure 7:
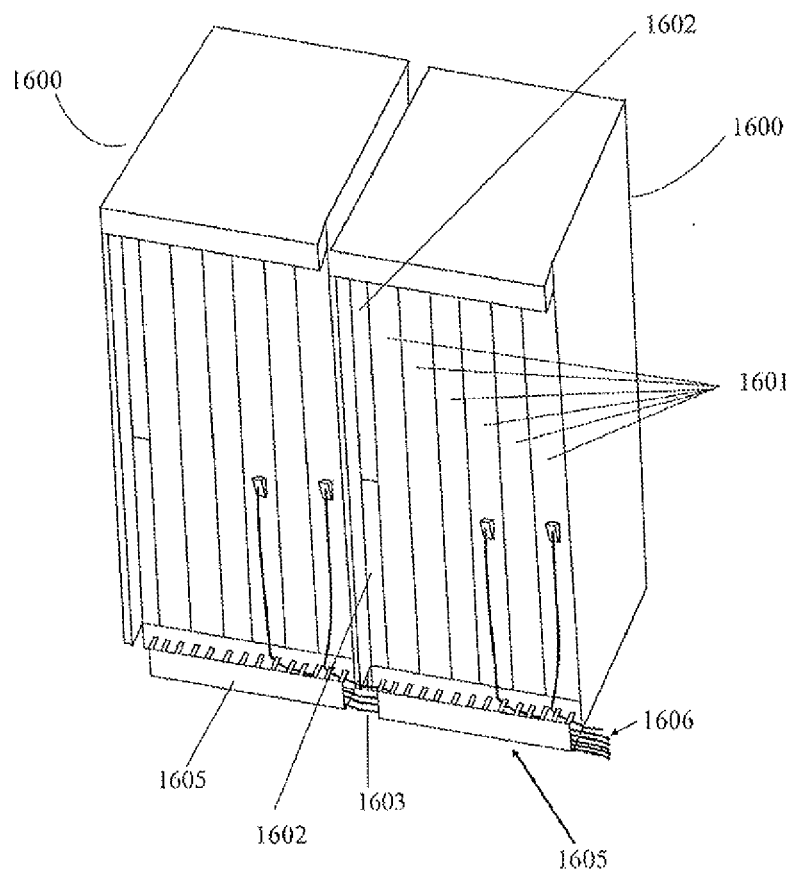
FIG. 7 is a perspective view of plural rack-mountable chassis mounted vertically, and showing cable routed between the chassis and through cable trays, according to an example embodiment of the invention.

In another example embodiment of the invention shown in FIG. 7, two vertically mounted chassis 1600 are shown adjacent to each other. In this embodiment individual ones of two chassis extend vertically, and collectively they are stacked along a horizontal direction. In such an arrangement stackable cable trays 1605, as represented in FIG. 7, extend horizontally and cables 1606 run at least partially through the cable trays 1605 and can connect to respective card modules 1601 and/or 1602. Cables can pass out of a cable tray 1605 towards the module connection at a position along the length of the cable tray 1605 which is directly below the module connection. If the cables 1606 were distributed to the module connections by a vertically oriented cable tray, a possibility would exist that cables routed to one module would prevent access to remove or install modules closer to the cable tray. However, by virtue of the arrangement of the stackable cable trays 1605 relative to the modules 1601 depicted in FIG. 7, cables 1606 can be distributed to vertically oriented modules without having cables terminating at one module crossing in front of other modules. Also, in FIG. 7, a cable escape passage 1603, like that of FIG. 6, is also formed between the two represented cable trays 1605 as shown.

Figure 8:
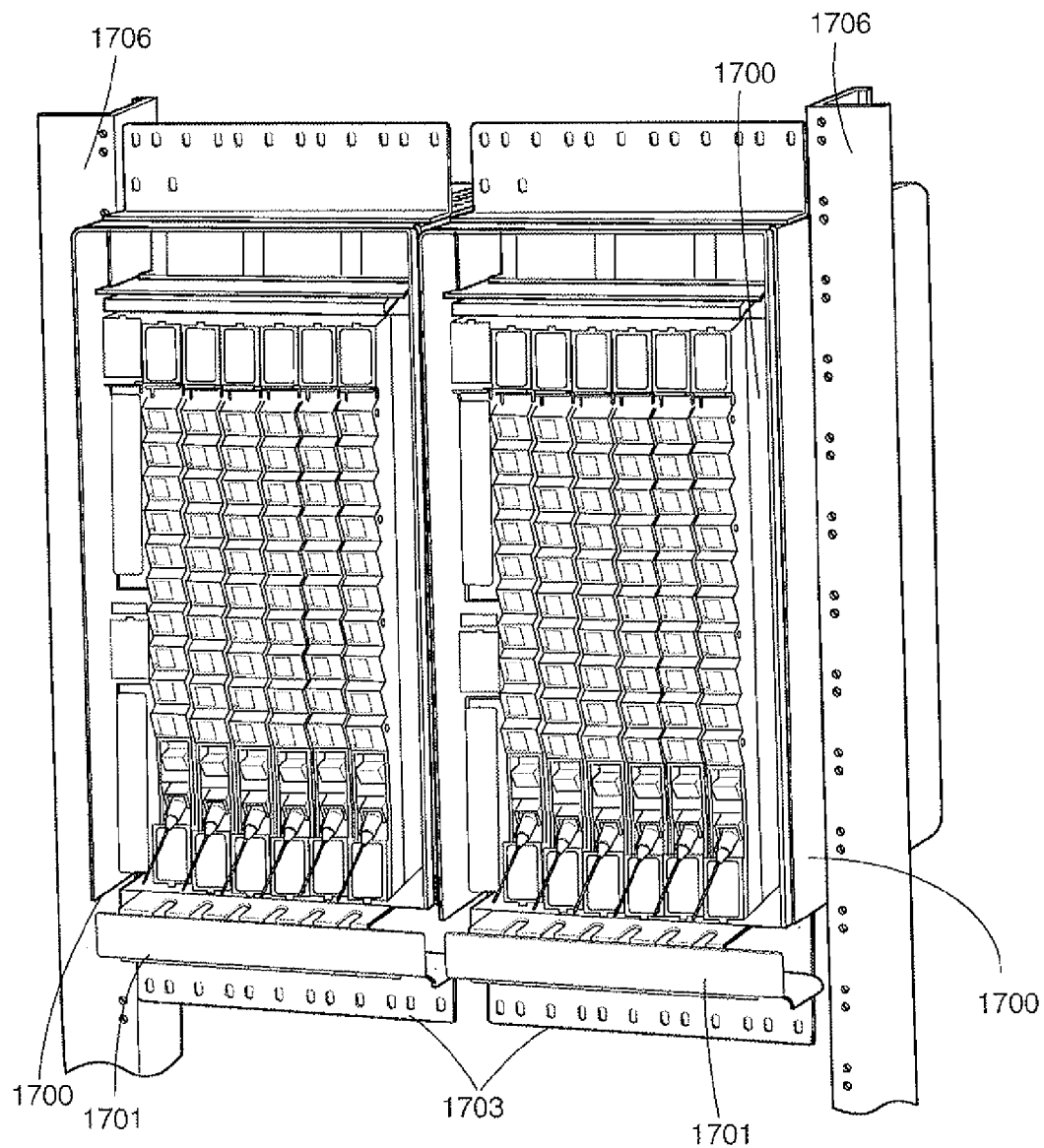
FIG. 8 is a detailed view of plural rack mountable chassis in a rack, according to an example embodiment of the invention.

FIG. 8 shows another view of a similar example embodiment as that shown in FIG. 7, wherein chassis 1700 are mounted vertically in a rack 1706. Cable trays 1701 are located between mounting brackets 1703. In this example embodiment the cable trays 1701 are substantially horizontally aligned by virtue of the chassis 1700 being mounted adjacent to each other in the manner shown.

Figure 9:
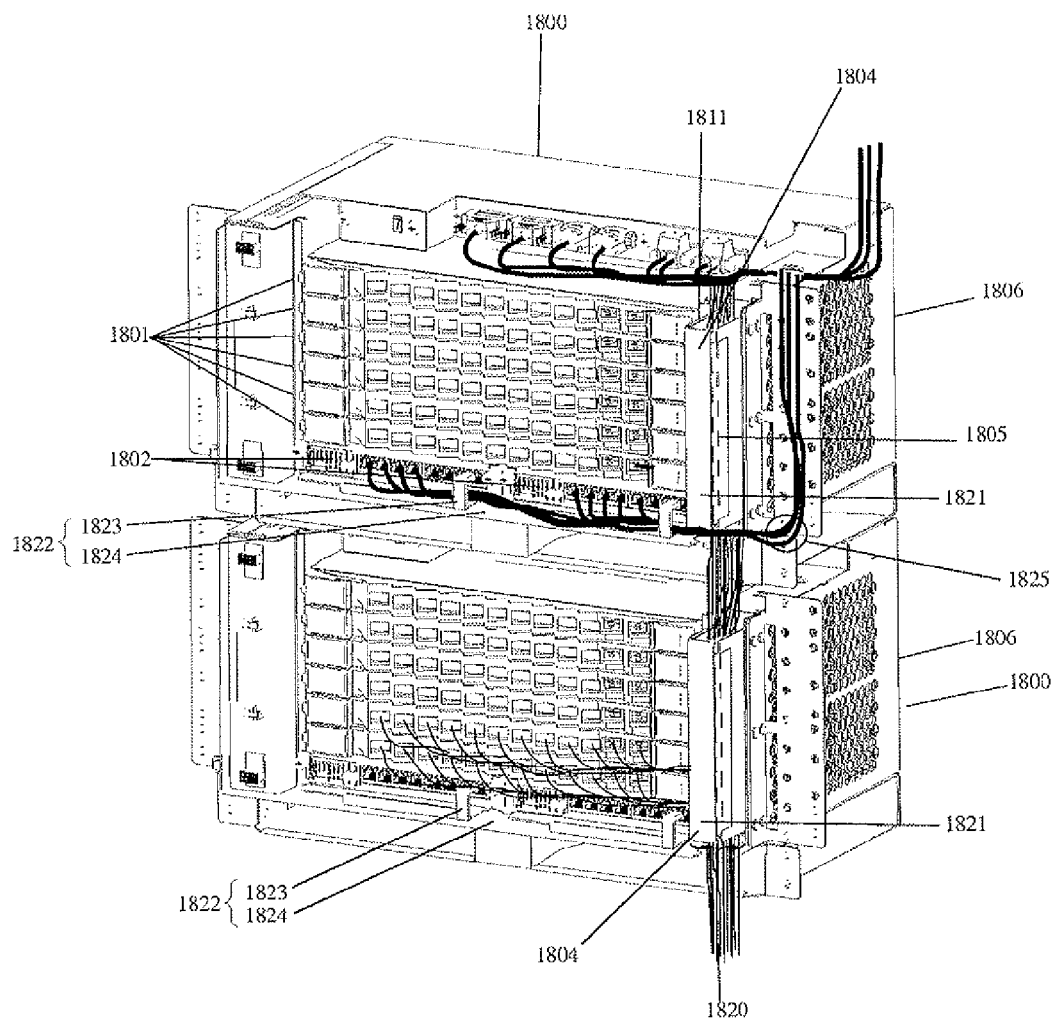
FIG. 9 is perspective view of an example embodiment of the invention that includes a cable tray and air plenums.

FIG. 9 shows an example embodiment that includes a cable tray 1804 mounted to a front face of each of plural chassis 1800 In an example embodiment of the invention, the cable tray 1804 forms a square, rectangular, or tubular shaped channel member having a U-shaped cross section and a front cover 1821. The tray 1804 has a base (not shown) and two projecting sides 1805, 1811 extending from opposite edges of the base, which can be attached to a face of a chassis 1800. Side 1811 has one or more openings (not shown) along its length for routing cables 1820 to and from card modules 1801, 1802. Side 1805 is shown as containing one or more holes although it may be solid instead. The cable tray front cover 1821 can be removable, hingedly connected to side 1805 and/or 1811, manually openable, and automatically openable, but alternatively the cover 1821 may be permanently or otherwise removably connected to side 1805 and/or 1811. In one example embodiment of the cable tray 1804, the cover 1821 is configured to be hingedly connected to side 1805 or 1811 and can be held in a closed position against the other respective side 1805 or 1811 using a magnetic closure (not shown). In another example embodiment of the cable tray 1804, the cover 1821 is configured to be connected to sides 1805 and 1811 by a snap fit closure.

The cable tray 1804 can be mounted to the front side of the chassis 1800 adjacent a second lateral side 1806, and can attach to the chassis 1800 with bolts, screws, threaded fasteners, and the like, or via any other suitable attachment. Because in this example embodiment the cable tray 1804 is mounted directly to the chassis 1800, no external cable management apparatus needs to be installed to route cables between card module slot locations in different chassis 1800 of the same rack, between chassis 1800 in different racks, and between card module locations within the same chassis 1800. In other embodiments of the invention, the tray 1804 can be mounted to other parts of the chassis 1800 besides side 1806, or more than one tray 1804 can be attached to the chassis, either at opposite parts of the front side or elsewhere. In still other embodiments, the cable tray can be removably attached to a selected part of a chassis, so that it can be easily removed. Of course, it should be noted that the cable trays described herein can be used in conjunction with other devices besides chassis as described herein. Indeed, it is within the scope of the invention to employ the cable trays in any situation where routing of wires, cables, or the like is needed.

Also shown in FIG. 9 are cable trays 1822, each coupled to an individual chassis 1800 at a location below modules 1802. The cable tray 1822 can include at least one finger 1823 extending from a base 1824 through which at least one cable 1825 (shown only in the top of the two chassis 1800 shown in FIG. 9) can pass. As shown in FIG. 9, cable tray 1822 is oriented horizontally such that the one end of the cable tray 1822 is in communication with an end of the cable tray 1804. A space (cable escape passage) can be formed (as shown in FIG. 9) at the intersection of the cable trays 1822, 1804 to permit the cable 1825 to pass around at least one of the cables 1820 passing vertically through the cable tray 1804. Cable tray 1822 is positioned at a predetermined angle with respect to the cable tray 1804, and is shown as being positioned perpendicular to cable tray 1804. While the end of the cable tray 1822 is shown as substantially intersecting with cable tray 1804 at an end of cable tray 1804, in other alternative embodiments, the cable trays 1822 and 1804 can intersect at other positions along their lengths. Moreover, while the cable tray 1822 is shown constructed with a plurality of fingers of a certain shape, in other embodiments of cable tray 1822 may be constructed to include other or different features, including a construction like that of cable tray 1804.

Figure 10:
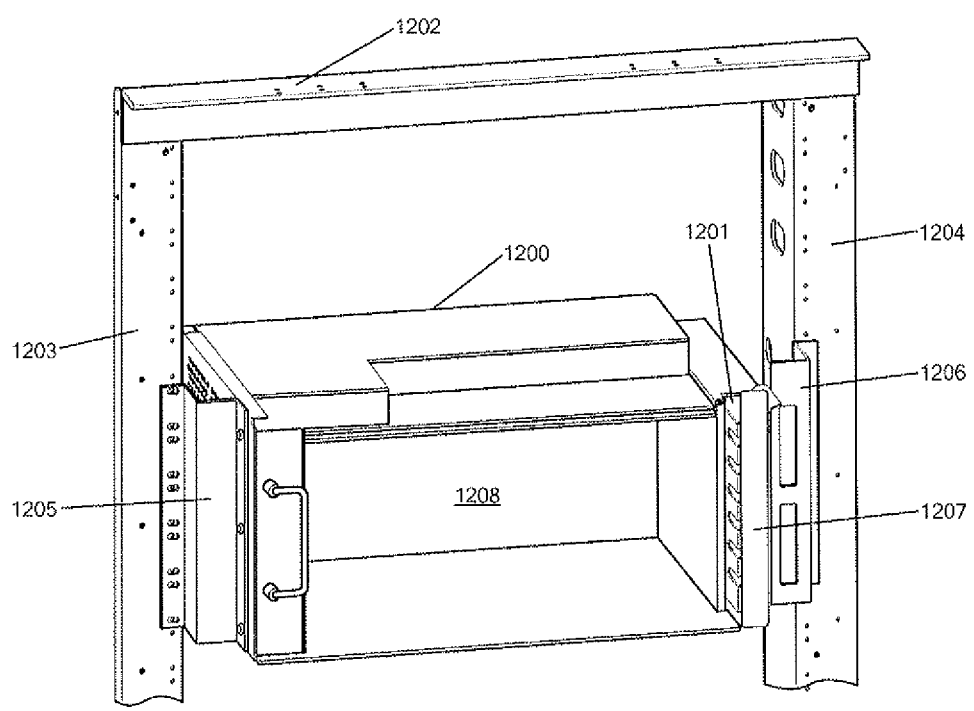
FIG. 10 is a perspective view of a rack mountable chassis in a rack, having a cable tray, according to an example embodiment of the invention.
Figure 11:
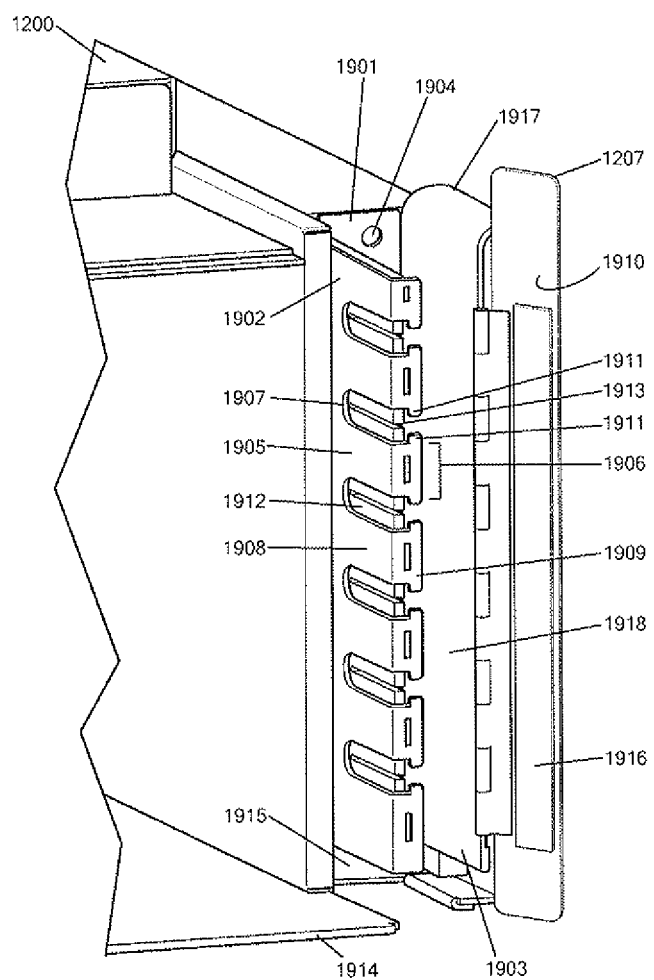
FIG. 11 is a detailed view of the example embodiment of the cable tray shown in FIG. 10.

Another example embodiment of a cable tray is shown in FIG. 10 and in greater detail in FIG. 11, where a cable tray is shown used in conjunction with a rack-mounted enclosure, such as a chassis 1200 for housing electronics. In FIG. 10 a chassis 1200 is attached to a rack 1202 with brackets 1205 and 1206. In the illustrated embodiment, a cable tray 1201 is attached to a portion of a front of the chassis 1200, and is positioned adjacent to an interior 1208 of the chassis 1200 that may be useful to house modular electronic equipment having electrical connectors located towards the front of the chassis when such equipment is installed. In FIGS. 10 and 11, the chassis 1200 is configured to permit modules (not shown) to be inserted horizontally therein, such that they are positioned transverse to the direction of the cable tray 1201. By virtue of this configuration, the connectors (not shown) located horizontally along a front face of a module (also not shown) can be substantially aligned with at least one opening of the cable tray 1201.

In FIG. 11 the cable tray 1201 is shown comprised of a base 1901 connected to a first side 1902 and an oppositely facing second side 1903, which is hingedly attached to an openable door 1207, shown in an open position. In FIG. 10, the door 1207 is shown in the closed position.

The base 1901 has at least one opening 1904 formed therein for attachment of the cable tray 1201 to the front of the chassis 1200 via an attachment mechanism, such as, for example, a mechanical fastener. The oppositely facing sides 1902 and 1903 are each arranged at predetermined angles relative to the base 1901, and are shown in FIG. 11 perpendicular to the base (although they need not be perpendicular).

The first side 1902 includes at least one projection 1905 having a free end 1906 extending away from the base 1901 by a predefined distance. In a case where the first side 1902 contains a plurality of projections 1905, as shown in FIG. 11, adjacent projections 1905 are separated from each other by a gap 1907 having a height sufficiently large to permit at least one cable to be inserted therein. The gap 1907 extends between the free ends 1906 of adjacent projections 1905, and from the ends 1906 toward the base 1901. The projections 1905 can be displaceable such that the free ends 1906 will deflect relative to an adjacent projection 1905 when the free end 1906 is displaced by applying a sufficient force to the displaced projection 1905.

In FIG. 11 projections 1905 are shown including a first planar portion 1908 extending by a first distance from the base 1901 at one end, and a second planar portion 1909 extending from the other end of the first portion 1908 by a second distance, the first and second planar portions being arranged at a predefined angle relative to each other, which is shown as ninety degrees (but which may be another angle). In the example embodiment shown in FIG. 11, the first distance is substantially the same as the distance that the second side 1903 extends away from the base 1901, and the second planar portion 1909 is configured to be in contact with an inner surface 1910 of the door 1207 when the door is in the closed position. While the projections 1905 and gaps 1907 are shown as being substantially uniform, in other embodiments the projections and gaps need not be uniform.

In FIG. 11, the projection 1905 also includes a third planar portion 1911, which is coplanar with the second portion 1909, and which has ends, each of which extends towards another third planar portion 1911 located on an adjacent projection 1905. In the illustrated embodiment each portion 1911 is longer than the corresponding projection 1905 in at least one direction in the common plane in which they both extend. The distance between oppositely facing third planar portions 1911 is sufficiently large to permit a cable (not shown) to be inserted therebetween when at least one of the projections 1905 is deflected relative to an adjacent projection 1905 to thereby increase the distance between the third portions by a sufficient amount to permit entry of the cable therebetween. When the projections 1905 are not in a deflected state, the third planar portions 1911, by virtue of their aforesaid configuration, extend into the gap 1907 by a suitable distance to retain any cable (not shown) in the gap. This can be useful to prevent a cable from being displaced out of the gap 1907 after being inserted into the gap 1907 when the door 1207 is in an open position.

The gaps 1907 between the projections 1905 may further include a cable cushion 1912 having a slot 1913 that is co-linear with the gap 1907. The cable cushion 1912 may be made from a material that suitably deflects and/or conforms around at least one cable when the cable is inserted within the slot 1913 of the cushion 1912. The cushion material can be suitable to resist displacement of the cable in one or more directions when the cable is within the slot 1913. The slot 1913 of the cable cushion 1912 is positioned with respect to the gap 1907 between the projections 1905 such that any cable inserted in the gap 1907 is also inserted into the slot 1913 of the cushion 1912. The cable cushion 1912 can be affixed to an inner surface of the first side 1902 of the cable tray 1201 facing the second side 1903 and can be held in place by any suitable fastening mechanism, although in other embodiments the cushion 1912 can be adhered to another suitable part of the tray 1201.

As shown in FIG. 11, the first side 1902 and second side 1903 extend between a predetermined distance above a ledge 1914 to approximately the top of the interior portion 1208 (FIG. 10) of the chassis. The ledge 1914 may be configured to be integral with the cable tray 1201 and can also be configured as a separate piece used in conjunction with the cable tray 1201. The vertical distance between the ledge 1914 and a lower edge of the first and second sides 1902, 1903 forms a cable escape passage 1915 that permits at least one cable (not shown) to be routed (either through or over) in a direction transverse to cables passing through the interior portion of the cable tray 1201. By virtue of this feature, modules connected with cables that would otherwise be too large to route through the cable tray 1201 or that would interfere with communication in other cables running through the interior of cable tray 1201, can be located near the ledge 1914 to provide the cables attached thereto access to the cable escape 1915 for routing.

While the ledge 1914 and cable escape passage 1915 are shown as being positioned near one end of the cable tray 1201, in another example embodiment (not shown) a ledge similar to the ledge 1914 and a cable escape passage similar to the cable escape passage 1915 may be located at other positions along the length of the cable tray 1201, in place of or in addition to the ledge 1914 and cable escape passage 1915. In one example embodiment (not shown) where cable tray 1201 is modified to include a cable escape passage (e.g., 1915) positioned at a location other than at an end of the cable tray 1201, a first modified cable escape opening (not shown) can be formed in the first side 1902 of the cable tray 1201 that is suitable in size and shape to permit a desired cable to pass therethrough. Also, a second modified cable escape opening, suitable in size and shape to permit the desired cable to pass therethrough can be formed in side 1903 at a location facing the modified cable escape opening. The desired cable can pass through the first and second modified cable escape openings in the sides 1902 and 1903 and through the interior 1918 of the cable tray 1201 in a direction transverse to the lengthwise orientation of the cable tray 1201 at a position other than at an end of the cable tray 1201.

The second side 1903 may include a curved edge 1917 at one end, shown at the top of the second side 1903. In one example embodiment, the curved edge 1917 has a bend radius configured to provide a strain relief for a cable routed between the interior of the cable tray 1201 and a location outside of the cable tray 1201 that is located above and substantially at an angle away from the chassis 1200.

The door 1207 has a vertical length, that in one example embodiment, is at least as long as the length of the first side 1902, and extends at least between a plane in which the bottom side of the chassis 1200 extends and a plane in which the top side of the chassis 1200 extends. When another chassis 1200 having a cable tray 1201 attached thereto is mounted adjacent to the chassis 1200 shown in FIG. 10, the interior portions of the adjacent cable trays 1201 can be aligned.

The door 1207 can be configured to include a magnet 1916 affixed to the inner surface of the door. The magnet 1916 is configured to close against the at least one projection 1909 when the door 1207 is in the closed position, and where the projection 1909 is made of magnetic attracting material. The magnetic force between the door 1207 and first side 1902 can hold the door 1207 in the closed position. Magnet 1916 can be configured as a pad or as an adhesive-backed magnet or magnetic pad.

Routing cables vertically along one side of a chassis can limit the mounting options of the chassis to a single horizontal mounting orientation. When the length of a chassis to be mounted is greater than the opening width of the rack, frame, or cabinet into which it is to be installed, it might still be possible to mount the chassis vertically, avoiding the need to replace either the chassis or the object into which it needs to fit. However, if cables are routed from a vertical bundle running along the side of the chassis, the cables terminating from some modules further from the bundle may cover over modules closer to the bundle and thereby make it impossible to obtain access to the latter module without disconnecting cables terminating from other modules.

The above described example embodiments of the stackable cable tray according to the present invention are useful in various ways. As but one example, a chassis that includes a stackable cable tray which does not fit horizontally in a rack may be mounted vertically in the same rack while providing for cables to be routed between the rack supports through the cable tray and then vertically to the termination location in the chassis. Such cable routing will not interfere with access to cables connected to adjacent modules in the chassis. The cable management feature is thus independent of the rack, frame, or cabinet to which the chassis is mounted and the mounting orientation of the chassis.

Moreover, providing a cable management tray that is independent of the rack, frame, or cabinet of the chassis, enables chassis and components designed to fit horizontally in one rack to be mounted vertically in another rack. This can be especially useful in the electronics, and more particularly the telecommunication industry.

For example, in North America and Europe, telecommunication racks having a nineteen (19) inch opening width are deployed. Also deployed in Europe are telecommunication racks having an opening width standardized by the European Telecommunications Standards Institute (ETSI). Moreover, telecommunication racks having an opening width of twenty three inches are deployed in North America. By attaching a stackable cable tray to a chassis designed specifically for one of these geographical markets, the chassis can be mounted at least vertically in a different sized rack while retaining cable management that is independent of the rack. Thus, the use of the stackable cable tray promotes product standardization and its associated benefits, including reduced costs of design, manufacturing, distribution, technical support, training, and inventory required for supporting multiple product families based on physical hardware configuration. Other benefits also exist and would be readily appreciated by one skilled in the art in view of this description.

While the invention has been particularly shown and described with respect to example embodiments thereof, it will be understood by those skilled in the art that changes in form and details may be made therein without departing from the scope and spirit of the invention.

What is claimed is:
1. A cable tray comprising:
a housing defining an interior portion, the housing having at least one positioned opening formed along a length of the housing, and plural open ends that are in communication with the interior portion and the at least one positioned opening for passage of at least one cable therethrough,
the housing mechanically coupled to at least one external surface forming at least part of a chassis configured to house equipment, such that when coupled, at least one of the plural open ends substantially aligns with at least one open end of a housing of at least one further cable tray coupled to a further external surface forming at least part of a further chassis configured to house equipment,
the housing extending substantially vertically when the chassis is disposed substantially in a horizontal orientation, and the housing extending substantially horizontally when the chassis is disposed substantially in a vertical orientation,
wherein the housing further has a channel and a cover, the channel defined by at least two oppositely facing sides separated by and extending from a base, and at least one of the sides is comprised of a plurality of spaced projections between which the at least one positioned opening is positioned, and
wherein the cover is coupled to the at least two oppositely facing sides by a snap fit closure.

2. The cable tray of claim 1, wherein the at least one positioned opening permits passage of the at least one cable between the interior portion of the housing and a location outside of the housing.

3. The cable tray of claim 1, wherein at least one of the housing and the chassis includes a cable escape configured to receive the at least one cable.

4. The cable tray of claim 3, wherein the cable escape is formed at an intersection between the cable tray and the further cable tray.

5. The cable tray of claim 1, wherein a cable escape is formed as a cutout in a lower surface of the chassis below the cable tray.

6. The cable tray of claim 1, wherein the cover is positionable to be in either a closed position in which it conceals the interior portion of the housing, or an open position, in which the cover does not conceal the interior portion.

7. The cable tray of claim 1, wherein the cable tray is disposed in an orientation that is at an angle relative to an orientation in which the further cable tray is disposed.

8. The cable tray of claim 1, further including at least one cable cushion having at least one cushion opening configured to receive the at least one cable, the cushion disposed at least partially within or next to the at least one positioned opening.

9. The cable tray of claim 1, wherein the chassis includes a ledge disposed at a predetermined angle relative to a lengthwise orientation of the cable tray.

10. A cable tray comprising:
a housing defining an interior portion, the housing having at least one positioned opening formed along a length of the housing, and plural open ends that are in communication with the interior portion and the at least one positioned opening for passage of at least one cable therethrough,
the housing mechanically coupled to at least one external surface forming at least part of a chassis configured to house equipment, such that when coupled, at least one of the plural open ends substantially aligns with at least one open end of a housing of at least one further cable tray coupled to a further external surface forming at least part of a further chassis configured to house equipment,
the housing extending substantially vertically when the chassis is disposed substantially in a horizontal orientation, and the housing extending substantially horizontally when the chassis is disposed substantially in a vertical orientation,
wherein the housing further has a base, and a plurality of spaced cable retaining fingers extending from the base, and
wherein at least one of a size and shape of at least some of the fingers is not uniform.

11. The cable tray of claim 10, wherein each finger is at least partly U-shaped.

12. The cable tray of claim 10, wherein the housing further includes a side extending from the base opposite to the fingers, the side having the interior side surface and separated from the fingers by at least a predefined distance.

13. The cable tray of claim 10, wherein at least one of the fingers has at least one projection extending toward a further projection extending from an adjacent finger, such that an opening formed between them is sufficiently large to permit the at least one cable to be inserted therebetween.

14. The cable tray of claim 10, wherein the housing further has a channel and a cover, the channel defined by at least two oppositely facing sides separated by and extending from the base, the cover arrangeable to be coupled to at least one of the sides, and at least one of the sides is comprised of the plurality of spaced cable retaining fingers.

15. The cable tray of claim 14, wherein the cover is hingedly coupled to the at least one side.

16. The cable tray of claim 14, wherein the plurality of spaced cable retaining fingers define the at least one positioned opening.

17. The cable tray of claim 14, wherein the cover is positionable to be in either a closed position in which it conceals the interior portion of the housing, or an open position, in which the cover does not conceal the interior portion.

18. The cable tray of claim 14, wherein the housing of the cable tray is configured to removably couple to the chassis.

19. A cable tray comprising:
a housing defining an interior portion, the housing having at least one positioned opening formed along a length of the housing, and plural open ends that are in communication with the interior portion and the at least one positioned opening for passage of at least one cable therethrough, the housing mechanically coupled to at least one external surface of a chassis configured to house equipment, such that when coupled, at least one of the plural open ends substantially aligns with at least one open end of a housing of at least one further cable tray, the housing comprising a base, at least two oppositely facing sides separated by and extending from the base, and a cover being arrangeable to be hingedly coupled to at least one of the sides, opposite to the base,
the housing extending substantially vertically when the chassis is disposed substantially in a horizontal orientation, and the housing extending substantially horizontally when the chassis is disposed substantially in a vertical orientation,
wherein at least one of the two oppositely facing sides includes a plurality of spaced cable retaining fingers, and
wherein at least one of a size and shape of at least some of the fingers is not uniform.

20. The cable tray of claim 19, wherein each finger is at least partly U-shaped.

21. A cable management system comprising:
a plurality of chassis; and
a plurality of cable trays, each mechanically coupled to a respective one of the chassis, each cable tray comprised of a housing defining an interior portion, the housing having at least one positioned opening formed along a length of the housing, and plural open ends that are in communication with the interior portion and the at least one positioned opening for passage of at least one cable therethrough,
at least one of the plural open ends of the housing of at least one of the cable trays substantially aligns with at least one open end of the housing of at least one other of the cable trays,
at least one of the cable trays extends substantially vertically when the chassis to which is it mechanically coupled is disposed substantially in a horizontal orientation, and the at least one cable tray extending substantially horizontally when the chassis to which it is mechanically coupled is disposed substantially in a vertical orientation.

22. The cable management system of claim 21, wherein at least one of the chassis comprises at least one ledge surface positioned at a location along a length of the cable tray coupled thereto and oriented at an angle relative to a lengthwise direction of that cable tray, the ledge configured to support at least one other cable in a direction substantially transverse to the direction of the cable tray.

23. The system of claim 21, wherein at least two of the plurality of cable trays are coupled to a single chassis.

* * * * *